United States Patent [19]

Auwerda et al.

[11] Patent Number: 4,714,589

[45] Date of Patent: Dec. 22, 1987

[54] METHOD OF AND DEVICE FOR COATING THE INSIDE OF TUBES

[75] Inventors: Cornelis P. Auwerda, Eindhoven, Netherlands; Peter E. E. Geittner, Aachen; Hans-Jürgen Lydtin, Stolberg, both of Fed. Rep. of Germany

[73] Assignee: U.S. Philips Corporation, New York, N.Y.

[21] Appl. No.: 880,263

[22] Filed: Jun. 30, 1986

[30] Foreign Application Priority Data

Aug. 7, 1985 [DE] Fed. Rep. of Germany ....... 3528275

[51] Int. Cl.$^4$ .............................................. B05D 3/06
[52] U.S. Cl. ........................................ 427/39; 65/3.12; 118/719; 118/723; 427/45.1; 427/163
[58] Field of Search ................... 427/38, 39, 45.1, 163; 118/719, 723; 65/3.12

[56] References Cited

U.S. PATENT DOCUMENTS

| | | |
|---|---|---|
| 3,484,276 | 12/1969 | Burggraaf et al. ................... 427/38 |
| 4,145,456 | 3/1979 | Kuppers et al. ..................... 427/39 |
| 4,145,458 | 3/1979 | Koenings et al. .................... 427/39 |
| 4,417,911 | 11/1983 | Cundy et al. ........................ 427/39 |
| 4,493,721 | 1/1985 | Auwerda et al. .................... 65/3.12 |
| 4,608,070 | 8/1986 | Roba .................................... 65/3.12 |

OTHER PUBLICATIONS

Geittner, P., et al., "Low-Loss Optical Fibers Prepared by Plasma-Activated Chemical Vapor Deposition (CVD)", *Appl. Phys. Lett.*, vol. 28, No. 11, pp. 645-646, (Jun. 1, 1976).

Kuppers, D., et al., "Preparation of Optical Waveguides with the Aid of Plasma-Activated Chemical Vapor Deposition at Low Pressures", *Topics in Current Chemistry*, vol. 89, pp. 107-131, (1980).

*Primary Examiner*—John H. Newsome
*Attorney, Agent, or Firm*—Marc D. Schechter

[57] ABSTRACT

The inside of a tube of an electrically insulating material is coated with a layer of electrically insulating material by reactive deposition of the coating material from a gas mixture which is passed through the tube. The tube is heated and the deposition is activated by a plasma produced by microwaves. The plasma reciprocates in the tube. Energy consumption is reduced by heating the tube to the reaction temperature at least partly by the energy supplied by the plasma to the tube wall. Thermal losses of the tube are reflected back to the tube wall by a heat reflecting element.

25 Claims, 3 Drawing Figures

METHOD OF AND DEVICE FOR COATING THE INSIDE OF TUBES

BACKGROUND OF THE INVENTION

The invention relates to a method of coating the inside of a tube of electrically insulating material with a layer of an electrically insulating material. The coating is provided by reactive deposition of a layer of an electrically insulating material from a gas mixture which is passed through the tube. The tube is heated thermally, and the deposition is activated by a plasma which is produced by microwaves and is reciprocated in the tube.

The invention further relates to a device for coating the inside of a tube of electrically insulating material with a layer of an electrically insulating material. The device comprises a gas inlet system for supplying the gas mixture to the tube, a microwave generator and a microwave resonator to produce and maintain a plasma in the gas mixture in the tube, means to reciprocate the plasma in the longitudinal direction of the tube, and means to thermally heat the tube.

A method and a device of this type are described for example, in articles by P. Geittner, et al. entitled "Low-loss optical fibers prepared by plasma-activated chemical vapor deposition (CVD)" (*Applied Physics Letters*, Vol. 28, No. 11, pages 645–646, June 1, 1976) and D. Kuppers, et al. entitled "Preparation of Optical Waveguides with the Aid of Plasma-Activated Chemical Vapour Deposition at Low Pressures" (*Topics in Current Chemistry*, Vol. 89, pages 107–131, 1980). In these articles, the manufacture of optical fibers according to the PCVD method is described. In this method a layer of a light-conducting material is deposited as electrically insulating material. The material is deposited by means of a plasma from a gas mixture containing the volatile starting materials. The material is deposited on the inside of the tube.

The tube either consists of synthetically manufactured amorphous quartz (fused silica, quartz glass) or of amorphous quartz manufactured from quartz crystals by melting. The tube may optionally be doped. It might alternatively consist of both amorphous quartz manufactured synthetically and of amorphous quartz manufactured from quartz crystals by melting.

After a quantity of light-conducting material corresponding to the intended optical fiber construction has been deposited, the tube is collapsed so as to form a solid preform from which optical fibers are drawn.

As is described in greater detail in the abovementioned articles, tube wall temperatures of between 1100° and 1300° C. are required for the deposition of adhering layers of a light-conductive material. In order to ensure that the tube reaches these temperatures during coating, a furnace is used as an additional energy source. Either a mobile furnace is provided, which is moved synchronously with the microwave resonator along the tube, or a stationary furnace is provided, in which a cooled microwave resonator is moved along the tube.

Tubes from which qualitatively high-grade optical fibers may be made can be produced by using both types of furnaces. However, certain disadvantages are also associated with both furnace types. Disadvantages of these furnaces are, for example, their cumbersome and expensive constructions, their large spaces occupied, their high inert masses, their high thermal inertia, and their high energy consumptions. Particularly disturbing is that most of the process heat provided by the plasma is lost by cooling the resonator and by radiation. Simultaneously, however, parts of the tube not screened off by the moving resonator must be additionally heated.

SUMMARY OF THE INVENTION

It is an object of the invention to provide a simple, low energy method and device for maintaining the tube wall at the desired high temperature.

According to the invention, the tube is heated at least partly by the energy supplied to the tube wall by the plasma, and the tube is kept at the reaction temperature by reflecting heat from the tube back to the tube wall by a heat-reflecting element.

Furthermore, according to the invention the means for thermally heating the tube comprises a heat-reflecting element for reflecting back to the tube the thermal energy provided by the plasma and dissipated by the tube.

The present invention is based on the idea not to dissipate the energy released by the plasma by cooling and irradiation, but to return it substantially to the tube by reflection of the thermal radiation from the tube. In this way, the temperature distribution over the length of the tube to be coated is uniform in time and over the length of the tube. However this is achieved by only a small additional supply of energy or by no additional supply of energy at all. The energy radiated from the tube, which in the wavelength range of $>2.8$ $\mu$m for quartz glass at temperatures of approximately 1500 K. is approximately 40% of the radiant energy of a black body, is returned according to the invention by a heat-reflecting element.

Particularly suitable as heat-reflecting elements are heat-reflecting filter arrangements with high reflectivities for thermal radiation energy produced by the tube at temperatures from about 1300 to 1600 K., in a wavelength range which is as large as possible. The heat-reflecting element therefor consists of at least one heat-reflecting filter.

Such a heat-reflecting filter consists of a substrate of a material which can withstand high temperatures, for example $SiO_2$, $Al_2O_3$ or heat-resistant steels. The substrate has provided thereon a layer of a heat-reflecting material, for example one or more metals, in particular nobel metals, $SnO_2$ or $In_2O_3$. The advantage of using such materials for the reflecting filters is that temperatures up to approximately 1600 K. reached during operation will hot damage either the substrate or the filter layer. The heat-reflecting material simultaneously reflect a large part of the thermal energy radiated at 1300 to 1600 K. During operation the substrate optionally may be cooled.

The heat-reflecting filter preferably has the form of a tube which is coated with heat-reflecting material. This tube is arranged concentric to the tube of electrically insulating material. The thermal energy radiated by the tube is reflected back uniformly over the circumference of the tube by the reflection filter in this way. Consequently, a circumferentially homogeneous temperature distribution is achieved.

The heat-reflecting coating may be provided nonuniformly over the length of the tube and/or over the circumference of the tube. In this embodiment, heat radiated by the tube of electrically insulating material nonuniformly over the tube length and/or over the tube circumference (caused, for example, by nonuniform energy supply of the moving plasma over the length and/or the circumference), nevertheless produces uniform temperature distributions. The nonuniform energy dissipation is suitably compensated for by the nonuniform reflection properties of the filter element.

In a further embodiment of the device according to the invention, several tubes coated with heat-reflecting materials are provided concentrically one around the other. The tubes are movable with respect to each other as regards their axial and/or peripheral positions. The reflection behavior of this arrangement varies in a variable and defined manner in the axial and/or peripheral directions, and hence the resulting temperature distributions on the tube of electrically insulating material can be varied in a controlled manner.

Three different reflector/resonator/tube arrangements are preferred.

In a first arrangement, the heat-reflecting filters are provided on both sides on the microwave resonator and can be reciprocated together with the resonator along the tube of electrically insulating material. In this way, an expensive cooling of the microwave resonator over the outer wall (as it is required in certain circumstances in the second arrangement) may be avoided.

In the second and third arrangements, the microwave resonator producing the plasma is arranged so as to be movable in the interior of or on the outside of at least one heat reflecting filter. This has the advantage that the position of the filter arrangement with respect to the tube to be coated remains constant. Consequently, axial and/or peripheral asymmetries in the energy dissipation can be optimally compensated for by a corresponding filter arrangement. A stationary filter moreover simplifies the mechanical construction and permits coating and moving the microwave resonator over the full length of the filter arrangement.

An additional heat source is preferably provided near one of the reversal points of the microwave resonator. Due to the required reversal of the movement of the plasma, the reversal points are heated nonuniformly axially. Compared with the remaining tube areas, the reversed points are heated too little. By providing an additional heat source at a reversal point, the tube to be coated can be brought to a sufficiently high and uniform temperature.

The additional heat source preferably consists of an electrically heated resistance furnace. The use of another heat source, for example a laser or hot air, is also possible but is technically more expensive and less effective in most cases.

The length of the additional heat source preferably corresponds to that of the plasma. As a result, only the ends of the tube (which ends are heated nonuniformly and inadequately by the plasma upon reversal of its movement) are heated by the additional heat source.

In a further preferred embodiment of the device according to the invention, the heat source surrounds the tube of electrically insulating material and heats the tube homogeneously in a peripheral direction. This provides the advantage that no additional peripheral asymmetries are produced by the additional heat source in the temperature distribution on the tube to be coated.

In another preferred form of the method according to the invention, the position of an additional heat source is fixed in at least one area of the reversal of the stroke with regard to the electrically insulating tube during the movement of the microwave resonator in another area of the tube. As a result, the tube areas which are heated nonuniformly and insufficiently by the plasma are heated effectively and permanently by the heat source during the forward and backward strokes of the plasma.

It is advantageous to vary the position of the heat source with respect to the tube of electrically insulating material during the stroke reversal of the microwave resonator. This is advantageous because the tube areas heated by the heat source are traversed by the microwave resonator and hence electrically insulating material can be deposited here also.

It is advantageous for the heat source to be moved axially by at least the width of the microwave resonator in the direction of movement of the microwave resonator. This is advantageous because the heat source can then be moved by the resonator itself. For example the heat source can be mechanically moved by the resonator against an elastically deformable element such as a spring. Consequently, after a stroke reversal the heat source again assumes its previous position over the tube.

The heat source is preferably arranged within the heat-reflecting filter. This is advantageous because the heat source directly heats the tube to be coated. Because of the surrounding filter, radiation losses can be kept small. This results in a particularly effective local heating.

DESCRIPTION OF THE PREFERRED EMBODIMENTS

Figure 1:
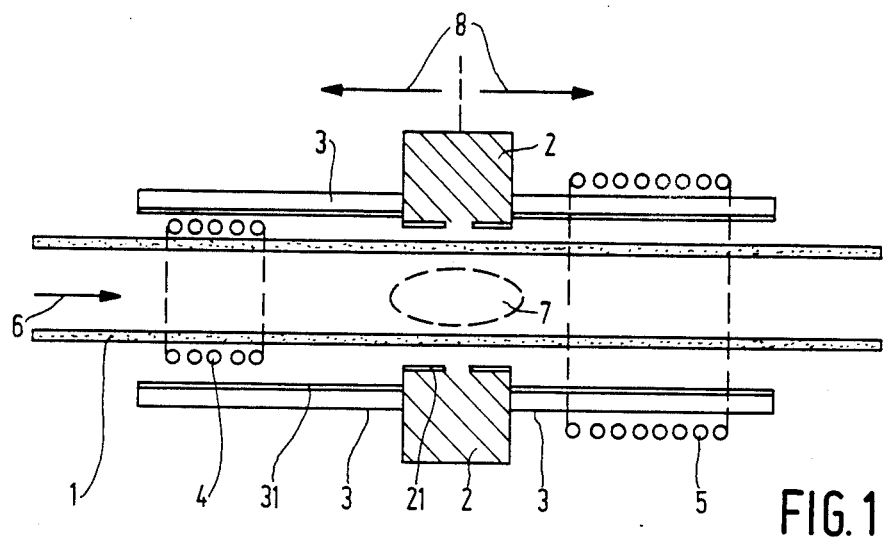
FIG. 1 is a schematic sectional view of a movable resonator/reflector arrangement according to the invention.

In FIG. 1, a quartz tube 1 to be coated is surrounded on both sides of a resonator 2 by cylindrical heat reflectors 3. Reflectors 3 are movable synchronously with the resonator along the quartz tube 1.

The heat reflectors 3 each comprise a heat-reflecting layer 31. The side of the resonator facing the quartz tube 1 is also provided, if desired, with a heat reflecting layer 21.

To compensate for radiation losses at the tube ends an additional heat source 4 is optionally provided between the heat reflector 3 and the quartz tube 1. A similar additional heat source 5 is optionally arranged over the whole length of the reflector to obtain the optimum substrate temperature when the plasma capacity is small. The reflector 3 has a variable or constant reflection coefficient along its axis and over its radius.

During operation of the device shown in FIG. 1, a gas mixture is introduced into the quartz tube 1. The direction of the gas flow is indicated by an arrow 6. Resonator 2 generates a plasma 7 in the tube 1. The reciprocating movement of the resonator is indicated by arrows 8.

Figure 2:
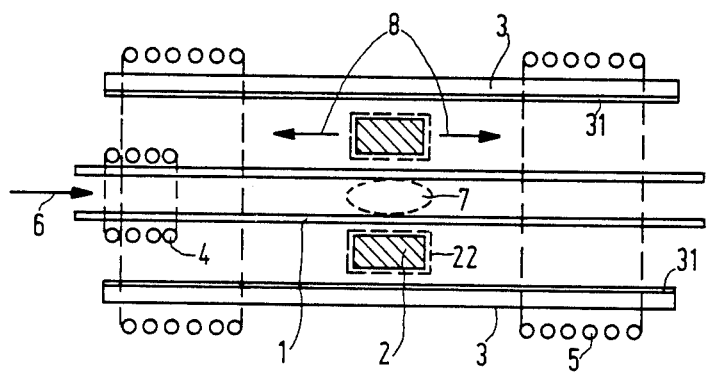
FIG. 2 is a schematic sectional view of a stationary reflector arrangement according to the invention.

In the device shown in FIG. 2, a quartz tube 1 and a heat insulated and/or cooled resonator 2 are arranged inside a heat reflector 3. The heat insulation or cooling of resonator 2 are indicated by a broke line envelope 22. Optionally, external and internal additional heat sources 4 and 5 are provided.

Figure 3:
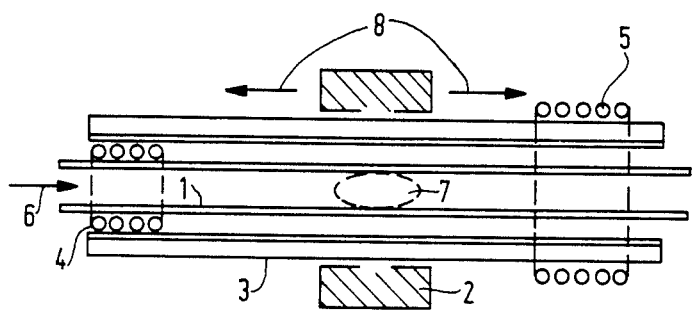
FIG. 3 is a schematic sectional view of a further stationary reflector arrangement according to the invention.

In the device shown in FIG. 3, a quartz tube 1 to be coated is surrounded by a cylindrical reflector 3. The arrangement of the reflection properties is such that the electromagnetic radiation reflects in the wavelength range between approximately 1 and 10 μm. In the long wavelength range (microwaves), however, the reflector 3 neither reflects nor absorbs radiation. The resonator 2 can then be arranged outside the reflector 3. As in the embodiments of FIGS. 1 and 2, additional heat sources 4 and 5 may be provided.

What is claimed is:

1. A method of coating the inside of a tube of an electrically insulating material with a second electrically insulating material by reactive deposition of the second electrically insulating material from a gas mixture which is passed through the tube, the tube being heated thermally and the deposition being activated by a plasma which is produced by microwaves and is reciprocated in the tube, characterized in that the tube is heated at least partly by the energy supplied by the plasma to the tube wall and is kept at the reaction temperature in that the thermal losses of the tube to the ambient are reflected back to the tube wall by a heat-reflecting element.

2. A method as claimed in claim 1, characterized in that the position of an additional heat source to heat the tube is kept staationary in at least one area of the stroke reversal with respect to the tube during the reciprocating movement of the plasma in the other areas of the tube.

3. A method as claimed in claim 2, characterized in that the position of the heat source is varied with respect to the tube for the duration of the stroke reversal of the plasma.

4. A method as claimed in claim 3, characterized in that the heat source is moved axially in the direction of the movement of the microwave resonator producing the plasma.

5. A device for coating the inside of a tube of an electrically insulating material with a second electrically insulating material by reactive deposition of the second electrically insulating material from a gas mixture which is passed through the tube, the device comprising a gas supply system for supplying the gas mixture to the tube, a microwave generator and a microwave resonator for producing and maintaining a plasma in the gas mixture in the tube, means for reciprocating the plasma in the longitudinal direction of the tube and means for thermally heating the tube, characterized in that the means for thermally heating the tube (1) comprise a heat-reflecting element (3) to return to the tube the thermal energy produced by the plasma (7) and dissipated by the tube.

6. A device as claimed in claim 5, characterized in that the heat-reflecting element consists of at least one heat-reflecting filter (3).

7. A device as claimed in claim 6, characterized in that the heat reflecting filter has the form of a tube (3) coated with heat-reflecting materials and arranged concentrically to the tube (1) of electrically insulating material.

8. A device as claimed in claim 7, characterized in that the heat reflecting coating (31) is provided non-uniformly over the tube length and/or over the tube circumference.

9. A device as claimed in claim 7 or 8, characterized in that several tubes (3) coated with heat-reflecting materials are provided concentrically one around the other and can be moved with respect to each other as regards their axial and/or peripheral positions.

10. A device as claimed in claim 9, characterized in that the heat-reflecting filters (3) are provided on both sides of the microwave resonator (2) and can be reciprocated with said resonator along the tube of electrically insulating material.

11. A device as claimed in claim 9, characterized in that the microwave generator (2) producing the plasma (7) is provided so as to be movable in the interior or on the outside of at least one heat-reflecting filter (3).

12. A device as claimed in claim 5, characterized in that an additional heat source (4, 5) is provided in at least one area of the reversal points of the microwave resonator (2).

13. A device as claimed in claim 12, characterized in that the heat source consists of an electrically heated resistance furnace (4, 5).

14. A device as claimed in claim 12, characterized in that the length of the heat source (4, 5) corresponds to that of the plasma (7).

15. A device as claimed in claim 14, characterized in that the heat source (4, 5) surrounds the tube (1) of electrically insulating material and heats same homogeneously in a peripheral direction.

16. A device as claimed in claim 15, characterized in that the heat source (5) is provided in the interior of the heat-reflecting filter (3).

17. A method of coating the inside of an electrically insulating substrate tube with an electrically insulating coating, said method comprising the steps of:
   passing a gas mixture through the substrate tube;
   heating the substrate tube;
   reacting the gas mixture in the substrate tube by irradiating a reaction zone in the substrate tube with microwave radiation to generate a plasma in the reaction zone; and
   reciprocating the plasma between first and second ends of a desposition zone in the substrate tube;
   characterized in that:
   the tube loses heat by heat radiation; and
   the tube is heated, in part, by reflecting the heat radiation back to the substrate tube.

18. A method as claimed in claim 17, characterized in that at the first end of the deposition zone, the substrate tube is heated to substantially the same temperature as at the middle of the deposition zone.

19. A device for coating the inside of an electrically insulating substrate tube with an electrically insulating coating, said device comprising:
   means for passing a gas mixture through the substrate tube;
   means for generating a plasma in a reaction zone in the substrate tube;
   means for reciprocating the plasma between first and second ends of a deposition zone in the substrate tube; and
   means for reflecting heat, which is radiated from the substrate tube, back to the substrate tube.

20. A device as claimed in claim 19, characterized in that the heat reflecting means comprises a reflector tube arranged around the substrate tube.

21. A device as claimed in claim 20, characterized in that the reflector tube is arranged concentrically around the substrate tube.

22. A device as claimed in claim 21, characterized in that:
   the reflector tube has an interior surface; and the reflector tube reflects heat nonuniformly over its interior surface.

23. A device as claimed in claim 19, characterized in that:
   the substrate tube has an axis; and
   the heat reflecting means comprises at least first and second reflector tubes arranged around the substrate tube, said reflector tubes being movable along the axis and being rotatable around the axis with respect to the substrate tube.

24. A device as claimed in claim 23, characterized in that the first and second reflector tubes have radii, and the radius of the first reflector tube exceeds the radius of the second reflector tube.

25. A device as claimed in claim 23, characterized in that the reflector tubes are affixed to opposing sides of the plasma generating means.

* * * * *